United States Patent
Park et al.

(10) Patent No.: US 7,919,771 B2
(45) Date of Patent: Apr. 5, 2011

(54) COMPOSITION FOR ELECTRON TRANSPORT LAYER, ELECTRON TRANSPORT LAYER MANUFACTURED THEREOF, AND ORGANIC ELECTROLUMINESCENT DEVICE INCLUDING THE ELECTRON TRANSPORT LAYER

(75) Inventors: Jong-Jin Park, Yongin-si (KR); Tae-Yong Noh, Gunpo-si (KR); Jae-Hwan Kim, Seoul (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1108 days.

(21) Appl. No.: 11/656,384

(22) Filed: Jan. 23, 2007

(65) Prior Publication Data

US 2007/0176547 A1 Aug. 2, 2007

(30) Foreign Application Priority Data

Jan. 27, 2006 (KR) .................. 10-2006-0009033

(51) Int. Cl.
*H01L 51/54* (2006.01)
(52) U.S. Cl. .............. 257/40; 428/689; 257/E51.043
(58) Field of Classification Search .......... 257/40, 257/E51.041–E51.044; 428/689–690
See application file for complete search history.

(56) References Cited

U.S. PATENT DOCUMENTS

| | | | |
|---|---|---|---|
| 7,323,635 B2 * | 1/2008 | Chittibabu et al. | 136/263 |
| 2002/0130616 A1 * | 9/2002 | Shirakawa et al. | 313/509 |
| 2003/0070583 A1 * | 4/2003 | Siegel et al. | 106/157.2 |
| 2006/0110618 A1 * | 5/2006 | Manivannan et al. | 428/566 |
| 2007/0178331 A1 * | 8/2007 | Park et al. | 428/690 |
| 2008/0142789 A1 * | 6/2008 | Suganuma | 257/40 |
| 2009/0039764 A1 * | 2/2009 | Cho et al. | 313/504 |

FOREIGN PATENT DOCUMENTS

| | | | |
|---|---|---|---|
| EP | 715217 A2 * | 6/1996 | |
| JP | 11102082 A * | 4/1999 | |
| WO | WO 2006025275 A1 * | 3/2006 | |
| WO | WO 2006098540 A1 * | 9/2006 | |

OTHER PUBLICATIONS

DuPont TyzorTM Organic Titanates and Zirconates, Technical Information for Printing Inks. Product Information Sheet, (2008).*
Baldo et al., "Excitonic singlet-triplet ratio in a semiconducting organic thin film" Physical Review B, 1999, vol. 60, pp. 14422-14428.
Baldo et al., "Highly efficient phosphorescent emission from organic electroluminescent devices", 1998, Nature, vol. 395, pp. 151-154.
Li et al. "Fabrication and electroluminescence of double-layered organic light-emitting diodes with the $Al_2O_3$/Al cathode", 1997, Appl. Phys. Lett., vol. 70, pp. 1233-1235.

* cited by examiner

*Primary Examiner* — Matthew W Such
(74) *Attorney, Agent, or Firm* — Robert E. Bushnell, Esq.

(57) ABSTRACT

Provided are a composition for an electron transport layer which can be wet coated at a low temperature, an electron transport layer manufactured by coating and drying the composition, and an organic electroluminescent device including the electron transport layer. The organic electroluminescent device including the electron transport layer manufactured by wet coating the composition for an electron transport layer has an improved electron injection into a light emitting layer, thereby having an excellent light emitting efficiency, low operating voltage, and improved lifespan.

20 Claims, 2 Drawing Sheets

COMPOSITION FOR ELECTRON TRANSPORT LAYER, ELECTRON TRANSPORT LAYER MANUFACTURED THEREOF, AND ORGANIC ELECTROLUMINESCENT DEVICE INCLUDING THE ELECTRON TRANSPORT LAYER

CROSS-REFERENCE TO RELATED PATENT APPLICATION AND CLAIM OR PRIORITY

This application claims the benefit of Korean Patent Application No. 10-2006-0009033, filed on Jan. 27, 2006, in the Korean Intellectual Property Office, the disclosure of which is incorporated herein in its entirety by reference.

BACKGROUND OF THE INVENTION

1. Field of the Invention

The present invention relates to a composition which can be used to manufacture an electron transport layer using a wet coating method at a low temperature, an electron transport layer manufactured using the same, and an organic electroluminescent device including the electron transport layer, and more particularly, to an organic electroluminescent device including an electron transport layer manufactured by coating and drying a composition for forming an electron transport layer which is a solution formed of a mixture of $Al_2O_3$ particles and a titanium precursor and thus, having low operating voltage and improved lifetime property.

2. Description of the Related Art

Organic electroluminescent devices, which are active display devices, use the recombination of electrons and holes in a fluorescent or phosphorescent organic compound thin layer (hereinafter, referred to as 'organic layer') to emit light when current is applied thereto. Organic electroluminescent devices are lightweight, have wide viewing angles, produce high-quality images, and can be manufactured using simple processes. Organic electroluminescent devices also can produce moving images with high color purity while having low consumption power and low voltage. Accordingly, organic electroluminescent devices are suitable for portable electronic applications.

In general, an organic electroluminescent device includes an anode, a hole transport layer, an emission layer, an electron transport layer, and a cathode sequentially stacked on a substrate. The hole transport layer, the light emitting layer, and the electron transport layer are organic membranes formed of organic compounds.

The organic electroluminescent device may operate as follows. When a voltage is applied between the anode and the cathode, holes emitted by the anode move to the light emitting layer via the hole transport layer. Electrons are emitted by the cathode and move to the light emitting layer via the electron transport layer. In the light emitting layer, the carriers recombine to produce excitons. The excitons radiatively decay, emitting light corresponding to a band gap of a material of the light emitting layer.

Materials that can be used for forming the light emitting layer of the organic electroluminescent device are divided, according to emission mechanism, into fluorescent materials using singlet excitons and phosphorescent materials using triplet-state excitons. The light emitting layer is formed by using such fluorescent materials or phosphorescent materials themselves or by doping such fluorescent materials or phosphorescent materials on appropriate host materials. When electrons are excited, singlet excitons and triplet excitons are generated in a host in the generation ratio of 1:3 (Baldo, et al., Phys. Rev. B, 1999, 60, 14422).

When fluorescent materials are used to form the light emitting layer in the organic electroluminescent device, triplet excitons that are generated in the host cannot be used. However, when phosphorescent materials are used to form the light emitting layer, both singlet excitons and triplet excitons can be used, and thus, an internal quantum efficiency of 100% can be obtained (see Baldo et al., Nature, Vol. 395, 151-154, 1998). Accordingly, the use of phosphorescent materials brings higher light emitting efficiency than use of fluorescent materials.

However, even though the light emitting efficiency improves by using such phosphorescent materials, adequate level of the light emitting efficiency required in a light emitting device is yet to be provided, and thus, various improvement methods of such light emitting devices have been devised.

One improvement method is inducing multiple light emission to improve the light emitting efficiency, instead of inducing single light emission by interposing a charge generation layer within the light emitting layer. Also, the light emitting efficiency can be improved by improving electrical and physical properties of metals and organic membranes to control interfacial property. However, the processes of such methods are complicated and thus, are too expensive or an adequate level of the light emitting efficiency required in a light emitting device can not be provided.

In addition, based on a method of improving charge delivery capacity using specific polymeric materials, the process of bonding holes and electrons to form activated molecules is optimized and the positions where these activated molecules emit light are uniformly dispersed, thereby improving the light emitting efficiency.

In relation to carrier injection, when the center of the light emitting layer is excited, densities of holes and electrons are balanced. This is the most important key in bringing high efficiency of a device.

For example, when the electron transport layer (ETL) is interposed between the organic light emitting layer (EML) and the cathode, most electrons emitted by the cathode move toward the anode to the EML to recombine with holes. However, when the hole transport layer (HTL) is interposed between the anode and EML, electrons that move into the EML are blocked by the interface of the HTL and thus cannot move further toward the anode and instead are kept in the EML, thereby improving recombining efficiency.

That is, when the ETL and the HTL are interposed between the EML and the electrode, the following improvements can be obtained: quantum efficiency increases; operating voltage lowers by injecting carriers by the second operation which passes through the transport layer instead of direct injecting; the light emitting efficiency improves, since electrons/holes injected into the light emitting layer are blocked by the hole/electron transport layer when moving to the anode/electrode, thereby enabling recombination control; and quenching (quenching is a phenomenon in which light emission of materials decreases as light emitting molecules become closer) can be prevented since singlet exciton generated by recombining of electrons and holes is formed on a boundary between the electrode and the light emitting layer.

In addition, a hole injection layer (HIL) may be interposed between the anode and HTL for a more efficient injection of holes, wherein the HIL is formed of an organic material having a work function of 5.0-5.2 eV which is decided by considering a work function of ITO anode electrode (4.7-5.0 eV) and Ionization Potential (IP) of HTL in order to lower an energy barrier when injecting holes to HTL from the anode.

Moreover, salts such as LiF and NaCl are further stacked between the cathode electrode and ETL to act as a buffer layer to improve efficiency of the device, here, differently from a concept of the HIL, metals having high reduction such as lithium and sodium are doped by co-evaporation near the interface of the cathode and thus, an electron injection barrier is lowered, thereby reducing a required operating voltage.

Electrodes highly affects to intensity of light emitted and efficiency of the organic electroluminescent device, this is because the intensity of light emitted depends on current injected into a light emitting device. Light emission efficiency in an Mg electrode is 50 times higher than in an Al electrode. Accordingly, Al electrodes need more buffer layers to inject electrons more efficiently.

When inorganic compounds are used in the ETL, both thermal and chemical stability are improved compared to when organic compounds are used and thus, when the device operates for long time, electron transport capacity does not change, thereby showing stable performance of the device for a long time.

An Al cathode and the light emitting layer have low efficiency. For example, when $Al_2O_3$ having a suitable thickness is interposed as the electron transport layer between the Al cathode and the light emitting layer of $Alq_3$, current injection and light emission output is highly improved. It arises from improved electron tunneling and removing exciton quenching and carrier trapping gap state on the $Alq_3$/Al interface [APL, 70, 1233(1997)].

However, when only $Al_2O_3$ is used in the ETL, improvement in the light emitting efficiency is limited. Therefore, development of more efficient ETL materials is required.

SUMMARY OF THE INVENTION

The present invention provides a composition for an electron transport layer which can be used to easily manufacture a thin film using a wet coating method at a low temperature, and which efficiently reduces an operating voltage of an organic electroluminescent device when used in the organic electroluminescent device.

The present invention also provides an electron transport layer formed using the composition.

The present invention also provides an organic electroluminescent device including the electron transport layer.

According to an aspect of the present invention, there is provided a composition for forming an electron transport layer including: $Al_2O_3$; a soluble titanium precursor; and a solvent.

The $Al_2O_3$ and the soluble titanium precursor may be in a weight ratio of a range between 1:10 and 4:1.

The soluble titanium precursor may be at least one selected from the group consisting of compounds represented by formulas 1 through 4:

$$Ti(OR)_4 \qquad \text{<Formula 1>}$$

where R is each independently $CH_3CO-CH=C(CH_3)-$, $C_2H_5OCO-CH=C(CH_3)-$, $-(CH_3)CH-COO^-NH_4^+$, $-COR'$, $-CO(C_6H_4)COOR''$, or a $C_1$-$C_{10}$ alkyl group;

R' is a substituted or unsubstituted $C_1$-$C_{10}$ alkyl group; and
R'' is a substituted or unsubstituted $C_1$-$C_{10}$ alkyl group.

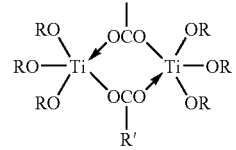

<Formula 2> where R is a substituted or unsubstituted $C_1$-$C_{10}$ alkyl group; and
R' is a substituted or unsubstituted $C_1$-$C_{10}$ alkyl group.

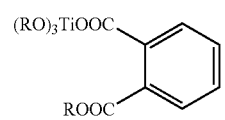

<Formula 3> where R is a substituted or unsubstituted $C_1$-$C_{10}$ alkyl group.

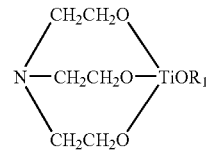

<Formula 4> where $R_1$ is a substituted or unsubstituted $C_1$-$C_{10}$ alkyl group.

According to another aspect of the present invention, there is provided an electron transport layer formed of porous $Al_2O_3$ and a titanium precursor which are manufactured by coating and drying the composition.

According to another aspect of the present invention, there is provided an organic electroluminescent device including: a first electrode; a second electrode; a light emitting layer interposed between the first electrode and the second electrode; an electron transport layer interposed between the second electrode and the light emitting layer, the electron transport layer formed from the composition.

According to another aspect of the present invention, there is provided an organic electroluminescent device including: a substrate; an anode formed on the substrate; a hole transport layer formed on the anode; a light emitting layer formed on the hole transport layer; an electron transport layer formed on the light emitting layer, the electron transport layer formed by coating and drying the composition.

The light emitting layer may include at least one host selected from the group consisting of one or more kind of polymer host, the mixture host of polymer and small molecule, small molecule host, and non-emitting polymer matrix.

The electron transport layer can be manufactured by coating a composition for an electron transport according to embodiments of the present invention at a low temperature in a form of dispersed solution. In an organic electroluminescent device including the electron transport layer, electrons easily transport, resulting in low operating voltage and excellent light emitting efficiency.

The electron transport layer according to embodiments of the present invention is manufactured by wet coating the composition in a dispersed solution type and drying the composition. The organic electroluminescent device using the electron transport layer of the present has an improved electron transporting, thereby having an excellent light emitting efficiency, low operating voltage, and improved lifespan.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
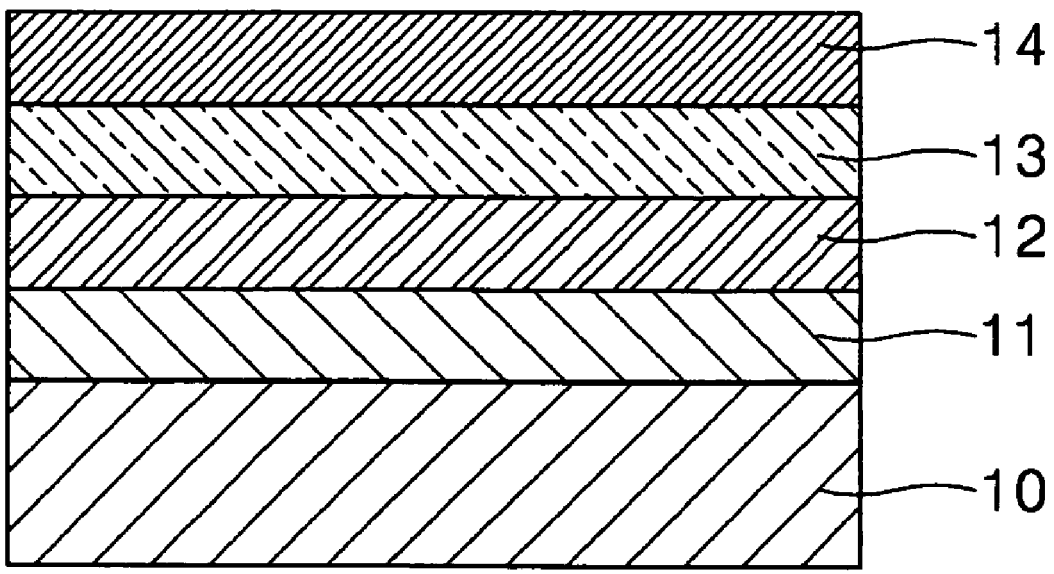
FIGS. 1a through 1c are diagrams schematically illustrating various laminated structures of an organic electroluminescent device according to embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

The present invention provides a composition including an inorganic electron transport material, and an electron transport layer manufactured using the composition. The present invention also provides a composition formed of $Al_2O_3$ and a soluble titanium precursor, and a solvent is included in the composition to provide a smooth coating. Since porous $Al_2O_3$ is used, the surface area of an electron transport layer widens, thereby showing excellent efficiency of electron transporting. Since a soluble titanium precursor is used, electric charge easily occurs and the composition becomes a dispersed solution type, thereby enabling the composition to be sprayed at a low temperature.

$Al_2O_3$ and a titanium precursor are insulating materials having high dielectric constant and may be suitable materials for forming an electron transport layer due to having good electron transportation properties.

$Al_2O_3$ used in embodiments of the present invention may have a specific surface area of 90 to 140 $m^2/g$ and a particle size of 20 nm to 150 nm. Examples of $Al_2O_3$ which are commercially available are PURALOX/CATALOX SBa series, PURALOX/CATALOX SCFa series, PURALOX/CATALOX SCCa series, PURALOX NGa series, PURALOX TH100/150, CARALOX HTa HTFa 101, and PURALOX SCFa-140L3.

The soluble titanium precursor may be at least one compound selected from the compounds represented by Formulae 1 through 4:

$$Ti(OR)_4 \qquad \text{<Formula 1>}$$

where R is each independently $CH_3CO-CH=C(CH_3)-$, $C_2H_5OCO-CH=C(CH_3)-$, $-(CH_3)CH-COO^-NH_4^+$, $-COR'$, $-CO(C_6H_4)COOR''$, or a $C_1$-$C_{10}$ alkyl group, R' is a substituted or unsubstituted $C_1$-$C_{10}$ alkyl group; and R'' is a substituted or unsubstituted $C_1$-$C_{10}$ alkyl group.

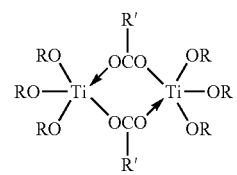

<Formula 2> where each R is independently a substituted or unsubstituted $C_1$-$C_{10}$ alkyl is group; and each R' is independently a substituted or unsubstituted $C_1$-$C_{10}$ alkyl group.

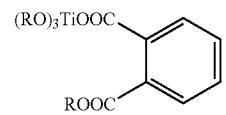

<Formula 3> where R is a substituted or unsubstituted $C_1$-$C_{10}$ alkyl group.

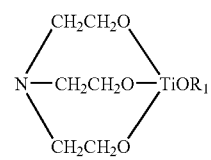

<Formula 4> where $R_1$ is a substituted or unsubstituted $C_1$-$C_{10}$ alkyl group.

The soluble titanium precursor may be one of tetraalkyl titanate and titanate chelate. Here, the term 'soluble' indicates that can be dissolved in an organic solvent to be in a liquid state.

Examples of the tetraalkyl titanate are tetraisopropyl titanate, tetra-n-butyltitanate, tetrakis(2-ethylhexyl)titanate, titanium ethoxide, or chlorotitanium triisopropoxide.

The titanate chelate may include at least one selected from the group consisting of Formulas 5 through 7:

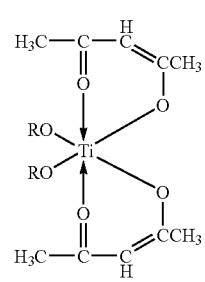

<Formula 5>

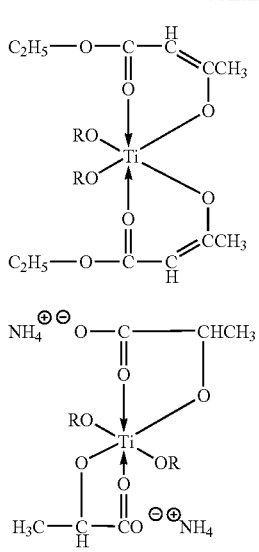

<Formula 6>

<Formula 7> where each R is independently a C1-C10 alkyl group.

The titanate chelate may be acetylacetonate titanate chelate, ethyl acetoacetate titanate chelate, triethanol ammine titanate, or ammonium salt of lactic acid titanate chelate.

The weight ratio of $Al_2O_3$ to the soluble titanium precursor of a composition thereof may be in a range between 1:10 and 4:1. When the weight ratio is out of the range and $Al_2O_3$ is too small, efficiency is decreased. Examples of the solvent used in the composition may be isopropyl alcohol, butanol, and hexanol, but the present invention is not limited thereto.

The amount of solvent used may be 10 to 80 parts by weight based on 100 parts by weight of a combined total amount of $Al_2O_3$ and the soluble titanium precursor used. When the amount of solvent used is below 10 parts by weight, dispersion and coating performance are difficult to control. When the amount of the solvent used is above 80 parts by weight, a thickness of a membrane may be difficult to adjust.

An electron transport layer is formed by coating and drying the composition of the embodiment of the present invention. The final product obtained from the composition having $Al_2O_3$ and a soluble titanium precursor and a solvent includes $Al_2O_3$ and a titanium precursor. Such an electron transport layer aids electron injection into a light emitting layer in order to recombine carriers in the light emitting layer and facilitates generation of activated molecules, thereby improving overall light emitting efficiency of a device.

Here, methods of coating and drying the composition according to embodiments of the present invention are not particularly restricted and drying may be performed by a hot air drying method.

The electron transport layer is formed on a substrate on which, for example, an anode, optionally a hole transport layer, and a light emitting layer are sequentially laminated, and then a cathode is disposed on the electron layer to realize an organic electroluminescent device.

The organic electroluminescent device may further include at least one layer selected from the group consisting of an electron injection layer, a hole injection layer, an electron blocking layer, and a hole blocking layer.

The materials used to form the anode of the organic electroluminescent device according to embodiments of the present invention may have a work function of more than 4 eV, and may include metals, alloy, electric conductance compounds, and a mixture thereof. In particular, metals such as Au or CuI and transparent conducting materials such as indium tin oxide (ITO), $SnO_2$ and ZnO can be used. The anode may be formed in a film having a thickness of 10 to 200 nm.

The materials used to form the cathode of the organic electroluminescent device according to the embodiments of the present invention may have a work function of more than 4 eV, and may include metals, alloy, electric conductance compounds, and a mixture thereof. In particular, Na, a Na—K alloy, calcium, magnesium, lithium, a lithium alloy, indium, aluminum, a magnesium alloy, and an aluminum alloy can be used. In addition to these materials, aluminum/lithium, magnesium/silver, or magnesium/indium can also be used. The cathode may be formed in a film having a thickness of 10-200 nm.

Examples of materials used to form the hole transport layer of the organic electroluminescent device according to the embodiments of the present invention include any material conventionally used to form hole transport layers and may be N,N'-diphenyl-N,N'-di(3-methylphenyl)-4,4'-diaminobiphenyl, N,N'-diphenyl-N,N'-dinaphthyl-4,4'-diaminobiphenyl, and porphyrinic compound derivatives such as N,N,N',N'-tetraphenyl-21H,23H-porphyrinic and the like; polymer having aromatic tertiary amine in a main chain or a side chain thereof, 1,1-bis(4-di-p-tolylaminophenyl)cyclohexane, N,N,N-tri(p-tolyl)amine, and triaryl amine derivatives such as 4,4', 4'-tris[N-(3-methylphenyl)-N-phenylamino]triphenylamine and the like; carbazole derivatives such as N-phenyl carbazole and polyvinyl carbazole; phthalocyanine derivatives such as non-metal phthalocyanine and copper phthalocyanine; Star-burst amine derivatives; enamine stilbene group derivatives; styrylamine compound derivatives such as aromatic tertiary amine; and polysilane.

The light emitting materials used to form the light emitting layer may be any conventional fluorescent and phosphorescent light emitting materials and may further include at least one host selected from the group consisting of one or more kind of polymer host, the mixture host of polymer and small molecule, small molecule host, and non-emitting polymer matrix. Here, for polymer host, small molecule host, and non-emitting polymer matrix, any materials conventionally used to form light emitting layers of conventional organic electroluminescent devices can be used. Examples of the polymer host are poly(vinylcarbazole), polyfluorene, poly(p-phenylenevinylene), and polythiophene and the like. Examples of the small molecule host are CBP (4,4'-N,N'-dicarbazole-biphenyl), 4,4'-bis[9-(3,6-biphenyl carbazolyl)]-1-1,1'-biphenyl{4,4'-bis[9-(3,6-biphenylcarbazolyl)]-1-1,1'-biphenyl}, 9,10-bis[(2',7'-t-butyl)-9',9''-spirobifluorenylanthracene, and tertafluorene. Examples of the non-emitting polymer matrix are polymethyl methacrylate and polystyrene. Overall, in the present invention the above examples are not limited thereto.

The thickness of the light emitting layer may be 30 to 100 nm. When the thickness of the light emitting layer is below 30 nm, efficiency and lifetime property are relatively low. When the thickness of the light emitting layer is above 100 nm, the operating voltage required is relatively high.

In the organic electroluminescent device, a buffer layer can be formed between each layer and materials for forming each buffer layer may be any materials which are conventionally used, for example, copper phthalocyanine, polythiophene, polyaniline, polyacetylene, polypyrrole, polyphenylene vinylene, or derivatives thereof, but not limited thereto.

The light emitting layer can be formed using various methods such as vacuum depositing, sputtering, printing, coating, ink jetting, and transcribing.

Figure 1B:
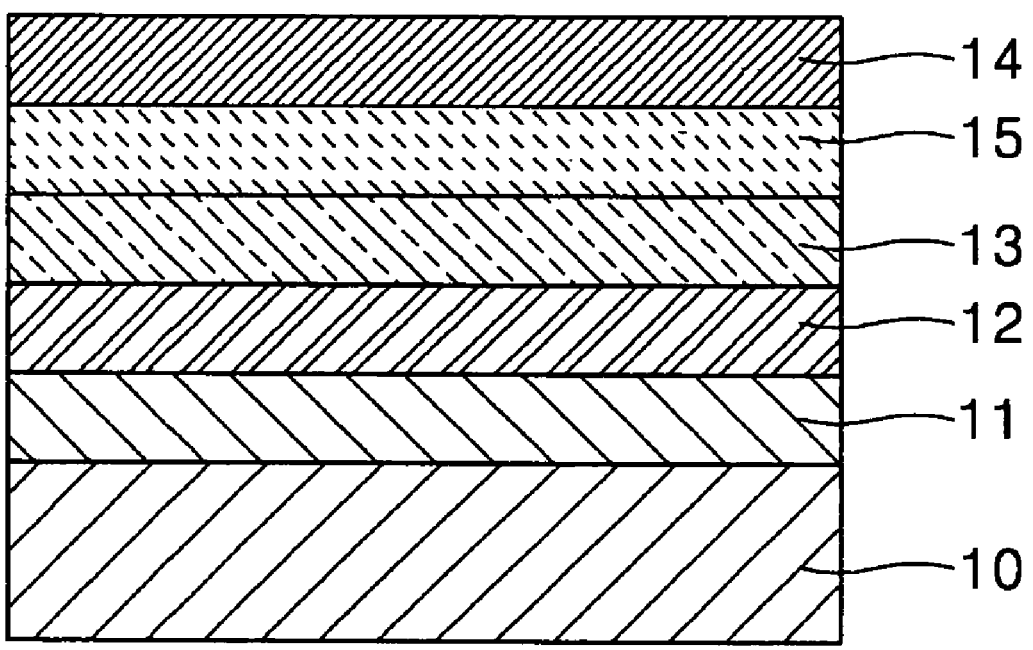
Figure 1C:
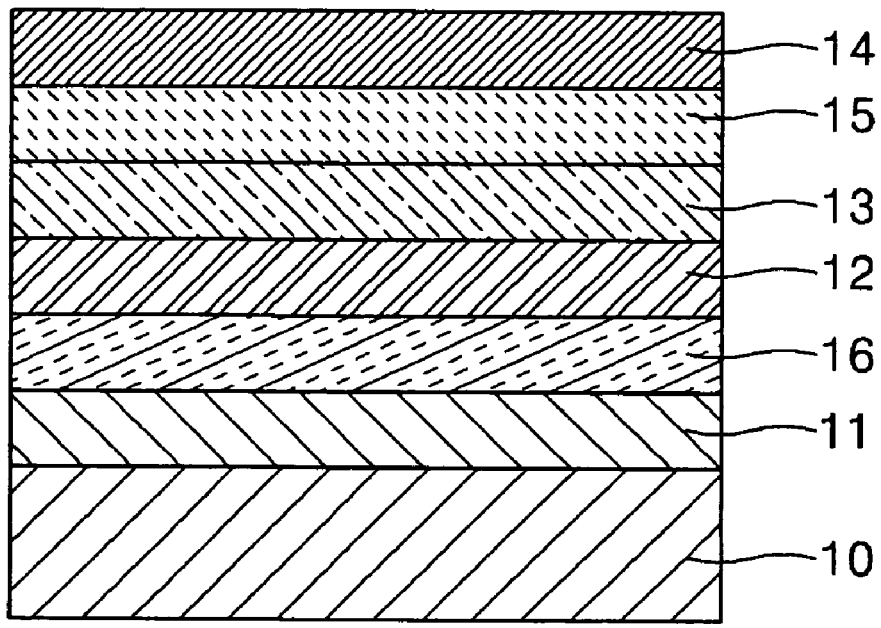

FIGS. 1a through 1c are diagrams schematically illustrating various laminated structures of an organic electroluminescent device according to embodiments of the present invention.

Referring to FIG. 1a, an organic electroluminescent device according to an embodiment of the present invention comprises a hole transport layer 11 and a light emitting layer 12 laminated on an anode 10 and an electron transport layer 13 and a cathode 14 formed on the light emitting layer 12.

Referring to FIG. 1b, the organic electroluminescent device according to an embodiment of the present invention comprises a hole transport layer 11 and a light emitting layer 12 laminated on an anode 10 and an electron transport layer 13, an electron injection layer 15 sequentially laminated on the light emitting layer 12. A cathode 14 is formed on the electron injection layer 15.

Referring to FIG. 1c, the organic electroluminescent device according to an embodiment of the present invention comprises a hole transport layer 11, an electron blocking layer 16, a light emitting layer 12, an electron transport layer 13, and an electron injection layer 15 sequentially laminated on an anode 10. A cathode 14 is formed on the electron injection layer 15.

The organic electroluminescent device having the laminated structure described above can be formed using a conventional manufacturing method and the method is not particularly restricted.

The organic EL device of the embodiments of the present invention can be made without special equipment and method. The organic EL device can be manufactured according to the conventional manufacturing method using light emitting materials.

The present invention will be described in greater detail with reference to following examples. The following examples are for illustrative purposes and are not intended to limit the scope of the invention.

Example 1

An ITO glass substrate 15 Ω/cm² (1500 Å) (manufactured by Corning) with the thickness of 150 nm was cut to a size of 50 mm×50 mm×0.7 mm, sequentially sonicated using a solution of a mixture of isopropyl alcohol and pure water having a mixing ratio of 1:1, pure water, and an isopropyl alcohol solution, and dried using an inert gas.

A polymer solution formed of a hole injection material, PEDOT/PSS (product name: AI 4083, Bayer Inc.) was spin coated to a thickness of 500 Å. Then, green 223 (Dow Inc.) which is a light emitting material (green light emitting material) was dissolved in toluene to be 10% by weight to form a light emitting layer having a thickness of 700 Å. Then, a solution of a mixture of 2 g of titanium isopropoxide, 1 g of isopropyl alcohol, and 0.2 g of $Al_2O_3$ (product name: PURALOX/CATALOX SCFa) was spin coated on the polymer light emitting layer at 2000 rpm for 2 minutes and then dried for 3 minutes at 150° C. to form an electron transport layer.

Then, Al was deposited at a speed of 10 Å/sec to form an anode with a thickness of 200 nm and the resultant structure was encapsulated, thereby completing manufacture of an organic electroluminescent device. Here, the encapsulating process was performed by sealing the resultant structure of the Al deposition in a glove box in which BaO powder was present in a dry nitrogen gas atmosphere and by final treating using a UV hardener.

Figure 2:
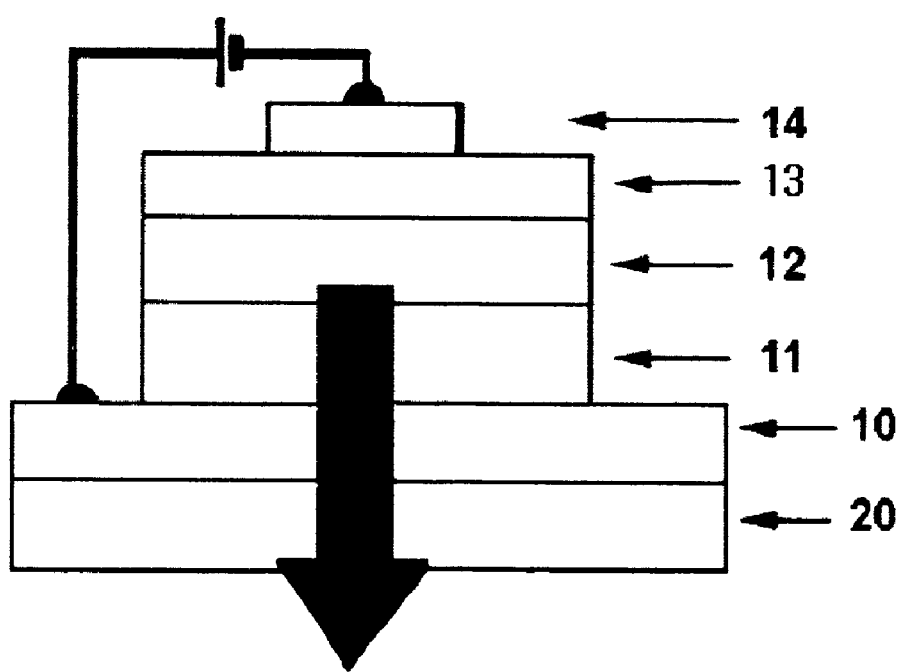
FIG. 2 is a diagram illustrating an organic electroluminescent device manufactured according to an embodiment of the present invention.

The organic electroluminescent device was a multi-layered device and its schematic view is illustrated in FIG. 2. In this case, the light emitting area of the organic EL device was 6 mm².

In a composition for forming an electron transport layer according to the embodiments of the present invention, a uniform thin film could be manufactured using a spin coating method.

Example 2

An organic electroluminescent device was manufactured in the same manner as in Example 1, except that 0.2 g of $Al_2O_3$, 2 g of tetra-n-butyl titanate as a titanium precursor and 1 g of butanol were used as a composition for forming an electron transport layer.

Example 3

An organic electroluminescent device was manufactured in the same manner as in Example 1, except that 0.2 g of $Al_2O_3$, 2 g of tetrakis(2-ethylhexyl)titanate as a titanium precursor, and 1 g of isopropyl alcohol as a solvent were used as a composition for forming an electron transport layer.

Comparative Example 1

An organic electroluminescent device was manufactured in the same manner as in Example 1, except that an electron transport layer was formed of $Alq_3$ and having a thickness of 250 Å on a light emitting layer.

The light emitting efficiency and lifetime property of the organic electroluminescent device obtained in Examples and Comparative Example above are illustrated in Table 1.

TABLE 1

| | Turn-on voltage/ voltage under 100 cd/m² | Maximum light emitting efficiency (cd/A) | Life time |
|---|---|---|---|
| Example 1 | 2.3/3.9 | 10.2 @ 8.0 V | 950 hr@1000 cd/m² |
| Example 2 | 2.8/3.8 | 15.6 @ 7 V | 920 hr@1000 cd/m² |
| Example 3 | 2.8/3.9 | 13.2 @ 10 V | 990 hr@1000 cd/m² |
| Comparative Example 1 | 3.1/4.1 | 9.2 @ 10 V | 580 hr@1000 cd/m² |

As illustrated in Table 1, the organic electroluminescent device including the electron transport layer according to the embodiments of the present invention which easily forms a thin film by a low temperature wet coating, shows high efficiency, and improves lifespan, in comparison with the organic electroluminescent device of the comparative example which is manufactured of conventional electron transport materials.

The organic electroluminescent device using the electron transport layer of the embodiment of the present invention has excellent light emitting efficiency, low operating voltage, and improved lifetime property.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A composition for forming an electron transport layer, comprising:

$Al_2O_3$;

a soluble titanium precursor comprising at least one selected from the group consisting of compounds represented by Formulae (1) through (4) and titanate chelate:

$Ti(OR)_4$                       (1)

where R is each independently $CH_3CO-CH=C(CH_3)-$, $C_2H_5OCO-CH=C(CH_3)-$, $-(CH_3)CH-COO^-NH_4^+$, $-COR'$, or $-CO(C_6H_4)COOR''$ where R' is a substituted or unsubstituted $C_1$-$C_{10}$ alkyl group, and R'' is a substituted or unsubstituted $C_1$-$C_{10}$ alkyl group;

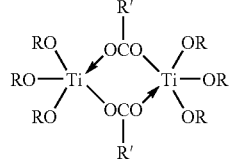

(2)

where R is a substituted or unsubstituted $C_1$-$C_{10}$ alkyl group, and R' is a substituted or unsubstituted $C_1$-$C_{10}$ alkyl group;

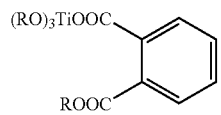

(3)

where R is a substituted or unsubstituted $C_1$-$C_{10}$ alkyl group;

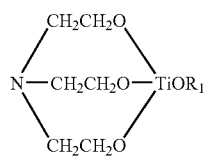

(4)

where $R_1$ is a substituted or unsubstituted $C_1$-$C_{10}$ alkyl group; and a solvent.

2. The composition of claim 1, wherein the $Al_2O_3$ and the soluble titanium precursor are in a weight ratio of a range from 1:10 to 4:1.

3. The composition of claim 1, wherein the soluble titanium precursor is represented by Formula 2:

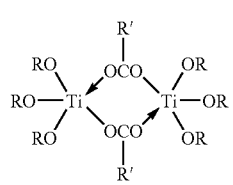

(2)

where R is a substituted or unsubstituted $C_1$-$C_{10}$ alkyl group, and R' is a substituted or unsubstituted $C_1$-$C_{10}$ alkyl group.

4. The composition of claim 1, wherein the soluble titanium precursor comprises the titanate chelate.

5. The composition of claim 4, wherein the titanate chelate includes at least one selected from the group consisting of compounds represented by Formulas 5 through 7:

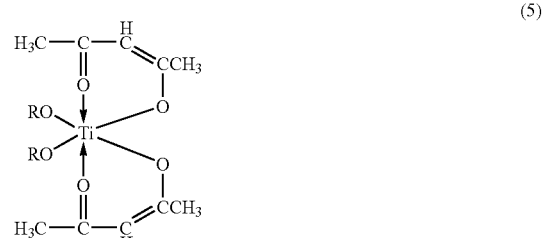

(5)

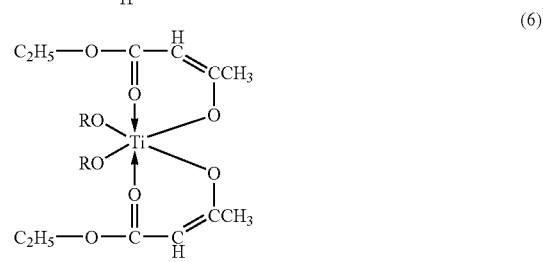

(6)

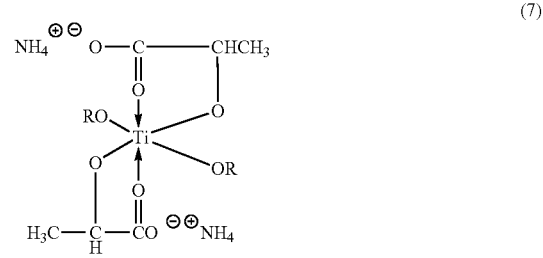

(7)

where, R is a C1-C10 alkyl group.

6. The composition of claim 4, wherein the titanate chelate is selected from the group consisting of acetylacetonate titanate chelate, ethyl acetoacetate titanate chelate, triethanolammine titanate, and ammonium salt of lactic acid titanate chelate.

7. The composition of claim 1, wherein the amount of the solvent is in the range of 10 to 80 parts by weight based on 100 parts by weight of the total amount of $Al_2O_3$ and the soluble titanium precursor.

8. An electron transport layer manufactured by coating and drying the composition of claim 1.

9. An organic electroluminescent device comprising a pair of electrodes, and an organic layer interposed between the pair of electrodes, the organic layer comprising an organic light emitting layer and the electron transport layer of claim 8.

10. The composition of claim 1, wherein the soluble titanium precursor is represented by Formula 3:

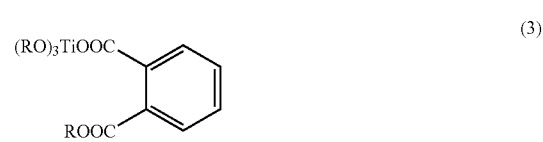

(3)

where R is a substituted or unsubstituted $C_1$-$C_{10}$ alkyl group.

11. The composition of claim 1, wherein the soluble titanium precursor is represented by Formula 4:

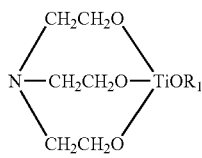

(4)

where $R_1$ is a substituted or unsubstituted $C_1$-$C_{10}$ alkyl group.

12. An organic electroluminescent device, comprising:
a first electrode;
a second electrode;
a light emitting layer interposed between the first electrode and the second electrode; and
an electron transport layer interposed between the second electrode and the light emitting layer, the electron transport layer formed from a composition comprising:
$Al_2O_3$;
a soluble titanium precursor selected from the group consisting of compounds represented by Formulae 1 through 4 and titanate chelate:

$Ti(OR)_4$ (1)

where R is each independently $CH_3CO—CH=C(CH_3)—$, $C_2H_5OCO—CH=C(CH_3)—$, $—(CH_3)CH—COO^-NH_4^+$, $—COR'$, or $—CO(C_6H_4)COOR''$ where R' is a substituted or unsubstituted $C_1$-$C_{10}$ alkyl group, and R'' is a substituted or unsubstituted $C_1$-$C_{10}$ alkyl group;

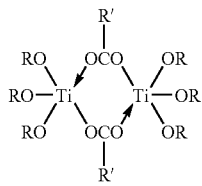

(2)

where R is a substituted or unsubstituted $C_1$-$C_{10}$ alkyl group, and R' is a substituted or unsubstituted $C_1$-$C_{10}$ alkyl group;

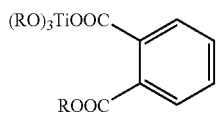

(3)

where R is a substituted or unsubstituted $C_1$-$C_{10}$ alkyl group; and

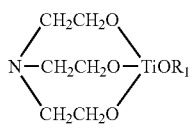

(4)

where $R_1$ is a substituted or unsubstituted $C_1$-$C_{10}$ alkyl group; and
a solvent.

13. The organic electroluminescent device of claim 12, wherein the $Al_2O_3$ and the soluble titanium precursor are in a weight ratio of a range from 1:9 to 4:1.

14. The organic electroluminescent device of claim 12, wherein the soluble titanium precursor comprises the titanate chelate.

15. The composition of claim 14, wherein the titanate chelate includes at least one selected from the group consisting of compounds represented by Formulas 5 through 7:

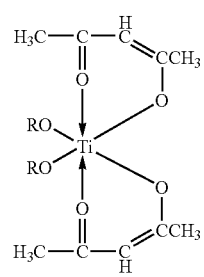

(5)

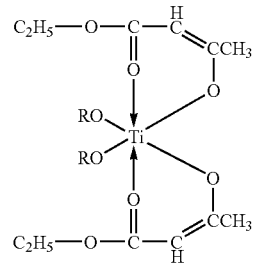

(6)

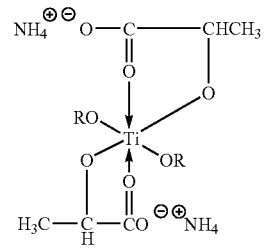

(7)

where, R is a C1-C10 alkyl group.

16. The organic electroluminescent device of claim 14, wherein the titanate chelate is selected from the group consisting of acetylacetonate titanate chelate, ethyl acetoacetate titanate chelate, triethanolammine titanate, and ammonium salt of lactic acid titanate chelate.

17. The organic electroluminescent device of claim 12, wherein the amount of the solvent is in the range of 10 to 80 parts by weight based on 100 parts by weight of the total amount of $Al_2O_3$ and the soluble titanium precursor.

18. An organic electroluminescent device, comprising:
a substrate;
an anode formed on the substrate;
a hole transport layer formed on the anode;
a light emitting layer formed on the hole transport layer;
an electron transport layer formed on the light emitting layer, the electron transport layer formed by coating and drying a composition, the composition comprising:
$Al_2O_3$;
a soluble titanium precursor selected from the group consisting of compounds represented by formulas 1 through 4 and titanate chelate:

$Ti(OR)_4$ (1)

where R is each independently $CH_3CO-CH=C(CH_3)-$, $C_2H_5OCO-CH=C(CH_3)-$, $-(CH_3)CH-COO^-NH_4^+$, $-COR'$, or $-CO(C_6H_4)COOR''$, where R' is a substituted or unsubstituted $C_1$-$C_{10}$ alkyl group, and R" is a substituted or unsubstituted $C_1$-$C_{10}$ alkyl group;

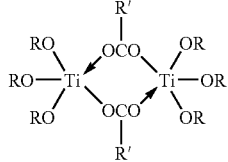
(2)

where R is a substituted or unsubstituted $C_1$-$C_{10}$ alkyl group, and R' is a substituted or unsubstituted $C_1$-$C_{10}$ alkyl group;

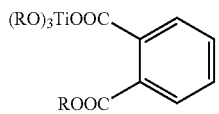
(3)

where R is a substituted or unsubstituted $C_1$-$C_{10}$ alkyl group;

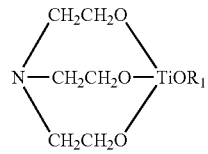
(4)

where $R_1$ is a substituted or unsubstituted $C_1$-$C_{10}$ alkyl group; and a solvent; and a cathode formed on the electron transport layer.

19. The organic electroluminescent device of claim 18, wherein the $Al_2O_3$ has a specific surface area of 90 to 140 $m^2/g$ and a particle size of 20 nm to 150 nm.

20. The organic electroluminescent device of claim 18, wherein the $Al_2O_3$ and the soluble titanium precursor are in a weight ratio of a range from 1:9 to 4:1, and the amount of the solvent is in the range from 10 to 80 parts by weight based on 100 parts by weight of the total amount of $Al_2O_3$ and the soluble titanium precursor.

* * * * *